(12) United States Patent
Lell et al.

(10) Patent No.: US 11,031,524 B2
(45) Date of Patent: *Jun. 8, 2021

(54) OPTOELECTRONIC COMPONENT HAVING A LAYER WITH LATERAL OFFSET INCLINED SIDE SURFACES

(71) Applicant: OSRAM Opto Semiconductors GmbH, Regensburg (DE)

(72) Inventors: Alfred Lell, Maxhuette-Haidhof (DE); Sven Gerhard, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/730,858

(22) Filed: Dec. 30, 2019

(65) Prior Publication Data

US 2020/0135964 A1  Apr. 30, 2020

Related U.S. Application Data

(63) Continuation of application No. 15/531,342, filed as application No. PCT/EP2015/077142 on Nov. 19, 2015, now Pat. No. 10,553,746.

(30) Foreign Application Priority Data

Nov. 28, 2014  (DE) ..................... 10 2014 117 510.7

(51) Int. Cl.
*H01L 29/06*   (2006.01)
*H01L 21/461*  (2006.01)
(Continued)

(52) U.S. Cl.
CPC .......... *H01L 33/0075* (2013.01); *H01L 33/20* (2013.01); *H01S 5/0202* (2013.01);
(Continued)

(58) Field of Classification Search
CPC ........ H01S 5/22; H01S 5/0202; H01S 5/0207; H01S 5/0217; H01L 33/20; H01L 33/0075

See application file for complete search history.

(56) References Cited

U.S. PATENT DOCUMENTS 5,821,571 A   10/1998  Lebby et al.
7,410,819 B2   8/2008  Takakura et al.
(Continued)

FOREIGN PATENT DOCUMENTS

CN   101043031 A    9/2007
CN   101859856 A   10/2010
(Continued)

OTHER PUBLICATIONS

Luke, K. et al., "Overcoming SiN Film Stress Limitations for High Quality Factor Ring Resonators," Photonics Society Summer Topical Meeting Series, Jul. 8, 2013, 2 pages.

*Primary Examiner* — Alonzo Chambliss
(74) *Attorney, Agent, or Firm* — Slater Matsil, LLP (57) ABSTRACT

An optoelectronic component and a method for producing an optoelectronic component are disclosed. In an embodiment the optoelectronic component includes a layer structure having an active zone for producing electromagnetic radiation, wherein the active zone is arranged in a first plane, wherein a recess is introduced into the surface of the layer structure, wherein the recess adjoins an end surface of the component, wherein the end surface is arranged in a second plane, wherein the second plane is arranged substantially perpendicularly to the first plane, wherein the recess has a bottom surface and a lateral surface wherein the lateral surface is arranged substantially perpendicularly to the end surface, wherein the lateral surface is arranged tilted at an angle not equal to 90° to the first plane of the active zone, (Continued)

and wherein the bottom surface is arranged in the region of the first plane of the active zone.

17 Claims, 9 Drawing Sheets

(51) Int. Cl.
*H01L 33/00* (2010.01)
*H01S 5/02* (2006.01)
*H01S 5/22* (2006.01)
*H01L 33/20* (2010.01)

(52) U.S. Cl.
CPC .......... *H01S 5/0207* (2013.01); *H01S 5/0217* (2013.01); *H01S 5/22* (2013.01); *H01L 33/0095* (2013.01)

(56) References Cited

U.S. PATENT DOCUMENTS

| | | | |
|---|---|---|---|
| 7,529,283 B2 | 5/2009 | Kamikawa et al. | |
| 7,638,838 B2 | 12/2009 | Chung et al. | |
| 7,724,793 B2 | 5/2010 | Kawakami et al. | |
| 7,772,611 B2 | 8/2010 | Kamikawa et al. | |
| 7,834,415 B2 | 11/2010 | Tanaka | |
| 7,885,304 B2 | 2/2011 | Miyake et al. | |
| 8,306,085 B2 | 11/2012 | Hasegawa et al. | |
| 8,686,432 B2 | 4/2014 | Fukuda | |
| 8,686,457 B2 | 4/2014 | Minato et al. | |
| 8,823,037 B2 | 9/2014 | Maute et al. | |
| 9,553,233 B2 | 1/2017 | Zhu et al. | |
| 9,818,815 B2 | 11/2017 | Funaya et al. | |
| 10,553,746 B2 * | 2/2020 | Lell .................. | H01S 5/22 |
| 2005/0052504 A1 | 3/2005 | Murai et al. | |
| 2005/0151153 A1 | 7/2005 | Kamikawa et al. | |
| 2005/0221590 A1 | 10/2005 | Kano et al. | |
| 2006/0109881 A1 | 5/2006 | Kwak et al. | |
| 2006/0209395 A1 | 9/2006 | Sasaoka | |
| 2007/0221977 A1 | 9/2007 | Tanaka | |
| 2008/0298409 A1 | 12/2008 | Yamashita et al. | |
| 2009/0137098 A1 | 5/2009 | Sakamoto et al. | |
| 2010/0230776 A1 | 9/2010 | Gogoi | |
| 2010/0265981 A1 | 10/2010 | Hiroyama et al. | |
| 2011/0278734 A1 | 11/2011 | Yen et al. | |
| 2011/0292959 A1 | 12/2011 | Shimamoto et al. | |
| 2012/0168809 A1 | 7/2012 | Maute et al. | |
| 2013/0001588 A1 | 1/2013 | Fukuda | |
| 2017/0330997 A1 | 11/2017 | Lell et al. | |

FOREIGN PATENT DOCUMENTS

| | | |
|---|---|---|
| CN | 103887287 A | 6/2014 |
| JP | 2001185802 A | 7/2001 |
| JP | 2004037945 A | 2/2004 |
| JP | 2004327879 A | 11/2004 |
| JP | 2005044996 A | 2/2005 |
| JP | 2005197347 A | 7/2005 |
| JP | 2006190980 A | 7/2006 |
| JP | 2006287137 A | 10/2006 |
| JP | 2007288137 A | 11/2007 |
| JP | 4266694 B2 | 5/2009 |
| JP | 2009267377 A | 11/2009 |
| JP | 2010123869 A | 6/2010 |
| JP | 2011029224 A | 2/2011 |
| JP | 2011052240 A | 3/2011 |
| JP | 2011249556 A | 12/2011 |
| JP | 2013012680 A | 1/2013 |
| WO | 2004086580 A1 | 10/2004 |
| WO | 2007074688 A1 | 7/2007 |
| WO | 2016083246 A1 | 6/2016 |

* cited by examiner

OPTOELECTRONIC COMPONENT HAVING A LAYER WITH LATERAL OFFSET INCLINED SIDE SURFACES

This application is a continuation of U.S. patent application Ser. No. 15/531,342 entitled "Optoelectronic Component Having a Layer with Lateral Offset Inclined Side Surfaces," filed May 26, 2017, which application is a national phase filing under section 371 of PCT/EP2015/077142, filed Nov. 19, 2015, which claims the priority of German patent application 10 2014 117 510.7, filed Nov. 28, 2014, each of which is incorporated herein by reference in its entirety.

TECHNICAL FIELD

The invention relates to an optoelectronic component and a method for producing an optoelectronic component.

BACKGROUND

U.S. Pat. No. 7,724,793 discloses an optoelectronic component comprising a recess, wherein the recess adjoins a mirror face. The recess comprises perpendicular side walls and a bottom face.

SUMMARY OF THE INVENTION

Embodiments of the invention provide an improved component and an improved method for producing a component.

One advantage of the proposed component is that the recess comprises at least one inclined side face. The recess comprising the inclined side face affords the advantage that the inclined side face may be reliably overmolded with a dielectric in order to achieve a passivation of the surface. Moreover, it is not necessary, in the case of a recess comprising an inclined side face, to precisely control the depth of the recess during production. For an effective action of the recess for preventing dislocations at a fracture edge, forming the recess with a defined depth in the region of the active zone is advantageous. In this case, the bottom face of the recess is arranged in the region of the active zone. The bottom face may be arranged in a region above or below the active zone.

In particular, the bottom face of the recess may be arranged in a range of from 200 nm above the plane of the active zone to 200 nm below the plane of the active zone. The optoelectronic component may be configured, e.g., as a laser diode or as a light emitting diode.

Experiments have shown that a depth of the recess in the range of between 100 nm and 800 nm is advantageous. If the recesses are too shallow, they are virtually ineffective for reducing dislocations, in particular at a mirror face. In a configuration with a recess that is too deep, the recess itself may again act like a defect center at which dislocations may form.

In one embodiment, the recess comprises a depth in relation to the surface of the layer structure that is in the range of between 100 nm and 800 nm. A sufficient protection of the active zone is achieved in this way.

In a further embodiment, at least one side face, in particular both side faces, comprise(s) an angle of 95° to 160° in an inclined manner relative to the plane of the active zone. These angle ranges enable a good protection of the active zone against the formation of dislocations at a fracture face. Depending on the embodiment chosen, the side faces may be arranged mirror-symmetrically with respect to one another or be arranged in a manner inclined at different inclination angles.

Particularly by means of an inclined side face which faces the active region of the active zone, what may be achieved is that dislocations that form proceeding from the recess in the direction of the active region of the active zone are diverted downward and extend below the active zone. This effect is brought about by virtue of the fact that dislocations always form perpendicularly to a side face.

Depending on the embodiment chosen, the recess may be arranged in a lateral edge region of the component and comprise, for example, only one side face in the fracture direction that faces the active zone. In a further embodiment, the recess comprises two side faces, wherein at least one of the two side faces, in particular the side face that faces the active zone, is arranged in a manner inclined relative to the first plane of the active zone.

In a further embodiment, the side face comprises two face sections, wherein one face section is arranged in an inclined manner and the second face section is aligned substantially perpendicularly to the plane of the active zone. Depending on the embodiment chosen, the inclined face section may be arranged above the straight face section or below the straight face section.

In a further embodiment, the recess comprises in a plane parallel to the second plane at least one rounded transition between the side face of the recess and a top side of the layer structure and/or a bottom face of the recess. The rounded formation of the edges in the transition region of the faces makes it possible to reduce the formation of imperfections, in particular of dislocations. In particular, sharp-edged transitions between the faces may be starting points of further imperfections.

In a further embodiment, the side face comprises two side sections arranged one above the other, wherein the side sections are arranged in a manner offset laterally with respect to one another. The side sections are connected to one another via a second bottom face. Depending on the embodiment chosen, both side sections or only one of the two side sections may be inclined and the other side section may be aligned perpendicularly.

Experiments have shown that with a recess which an extent in the second plane perpendicular to the longitudinal extension of the active region of the active zone in the range of 10 μm to 200 μm, good effects are achieved for the suppression of imperfections, in particular of dislocations in the region of the end face, that is to say in the region of the facet of the laser diode or of the light emitting diode (LED).

Moreover, experiments have shown that good results are achieved in the suppression of facet imperfections if the recess comprises a distance in the range of 10 μm to 150 μm from the active region of the active zone. In a further embodiment, a mesa trench is provided between a side of the component and the recess. Stresses of the layer structure may be reduced by the mesa trench.

In one embodiment, use is made of a method for producing a component, wherein the recess is introduced into the layer structure with the aid of an etching process, wherein a lateral widening of an etching opening of an etching mask is at least partly carried out during the etching process, such that the recess comprises at least one side face arranged in an inclined manner.

In a further embodiment, etching masks of different hardnesses are used during the etching process, in order to produce the recess with at least one inclined side face. A soft etching mask may be formed, for example, from photoresist, or SiNx or a semiconductor material or a metal.

BRIEF DESCRIPTION OF THE DRAWINGS

The invention is explained in greater detail below with reference to the figures, in which.

DETAILED DESCRIPTION OF ILLUSTRATIVE EMBODIMENTS

One concept of the present exemplary embodiments consists in reducing or avoiding the formation of stepped imperfections at a cleavage edge, that is to say an end face of the laser diode or the light emitting diode (LED) that is produced by cleavage, with the aid of at least one recess comprising at least one side face which faces a mode space, i.e., an active region of the active zone of the laser diode or the light emitting diode (LED), and which is arranged at an angle of not equal to 90° relative to the plane of the active zone of the laser diode/LED. In addition, the recesses are formed in such a way as to achieve an efficient shielding of the active zone against dislocations in the mode space. In addition, the geometry and the arrangement of the recess are chosen in such a way that the recess may be produced rapidly.

Experiments have shown that flanks of a recess that run out in a flat fashion and in particular are rounded have the effect that an etching depth is significantly less critical and even relatively deeply etched recesses comprising flanks that run out in a flat fashion and/or are rounded do not themselves act as defect centers for the formation of stepped dislocations of the cleavage edge upon the cleavage of the cleavage edge, wherein the stepped dislocations may again extend into the active region of the laser diode/LED. One reason for this is that flanks that slope in a flat fashion or are rounded comprise a significant reduction of stress fields in comparison with perpendicular flanks. Consequently, recesses formed in this way need not be controlled in their etching depth as accurately as recesses comprising perpendicular flanks. A significant process simplification is achieved as a result.

Furthermore, recesses comprising flanks that run out in a flat fashion are overmolded better by a dielectric passivation, with the result that an improvement in the quality and an increase in the yield of the components are achieved. Moreover, experiments have shown that oblique flanks of the recess in the region of a transverse facet cause the transverse facet to turn away in the direction of the wafer surface, with the result that a more effective interception of a transverse facet is achieved. Consequently, it is possible to provide an optoelectronic component comprising a good surface quality in the active region of the laser facet. As a result, low threshold currents, high transconductances, a high efficiency and also a high component stability and a good beam quality may be achieved.

The optoelectronic component is configured, for example, as an edge emitting laser diode or a light emitting diode (LED). In particular, the laser diode/LED may be produced from a III-V semiconductor material, in particular from indium gallium nitride.

Figure 1:
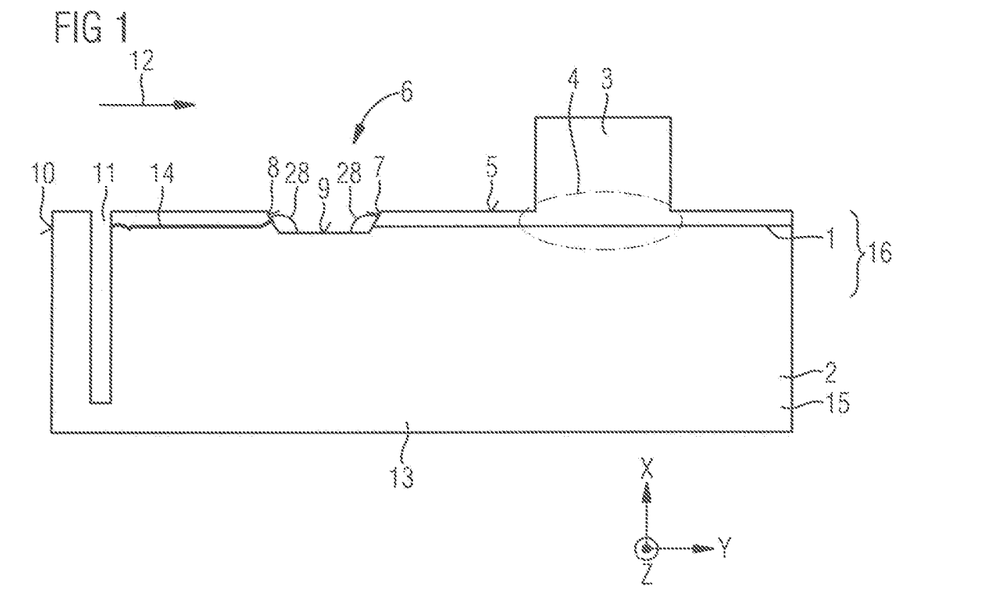
FIG. 1 shows a schematic view of an end face of an optoelectronic component.

FIG. 1 shows, in a schematic illustration, a view of an end face 13 of an optoelectronic component configured, e.g., as a light emitting diode (LED) or as a laser diode, in particular as a stripe laser diode. A layer arrangement is provided, which in the upper end region comprises a layer structure 2 comprising an active zone 1. The active zone 1 may comprise a plurality of layers arranged in a first plane. The first plane is aligned perpendicularly to the image plane. The first plane is formed parallel to the y-axis and to the z-axis. The x-axis is aligned perpendicularly to the y-axis. The z-axis is perpendicular to the plane y-x. A ridge 3 is arranged on the layer structure 2, said ridge being aligned along the z-axis. The ridge 3 serves to concentrate the laser light below the ridge 3 in a laser mode region 4. The laser mode region 4 extends along the z-axis and occupies a region of the active zone 1 and of adjoining layers below the ridge 3. A recess 6 is introduced into the surface 5 of the layer structure 2 laterally alongside the ridge 3. The recess 6 comprises two side faces 7, 8 and a bottom face 9. The side faces 7, 8 are arranged in a manner inclined at an angle 28 with respect to the first plane of the active zone 1, which angle is not equal to 90°. The first and second side faces 7, 8 comprise, for example, an angle 28 of between 95° and 160°, in particular between 98° and 130°. Depending on the embodiment chosen, the first and second side faces 7, 8 may also comprise an angle of between 100° and 115° relative to the first plane. The first side face 7 faces the laser mode region 4. The second side face 8 is arranged opposite with respect to the first side face 7. Depending on the embodiment chosen, the second side face 8 may be dispensed with and the recess 6 may extend as far as a lateral edge region 10 or a trench 11, which may constitute a mesa trench. In the exemplary embodiment illustrated, the trench 11 comprises perpendicular side faces and is formed with a greater depth than the recess 6.

If the layer structure 2 is then fractured along a fracture direction 12, a dislocation 14 may form at the fractured end face 13, for example, proceeding from a side face of the trench 11. By virtue of the recess 6 being provided, the dislocation 14 may not pass right into the region of the laser mode 4, but rather is intercepted by the recess 6. The end face 13 constitutes an emission face or a mirror face at which the electromagnetic radiation, in particular, the laser mode, is specularly reflected or output. Consequently, dislocations or defects of a planar fracture face 13 should be avoided in particular in the region of the laser mode 4. For an optimum effect as a mirror face or emission face, the fracture face 13 should as far as possible be free of dislocations in the region of the laser mode 4.

Depending on the embodiment chosen, the trench 11, which may constitute a mesa trench, may be dispensed with. The layer structure 2 may comprise a substrate 15 in the lower region, onto which substrate epitaxially grown layers 16 were deposited. The layers 16 also comprise the active zone 1. The substrate and/or the semiconductor layer may be based on a III-V compound semiconductor or a II-VI compound semiconductor or zinc oxide. The II-VI compound semiconductor may be a sulfide or a selenide. The III-V compound semiconductor may be based on a nitride compound semiconductor, a phosphide compound semiconductor, an antimonite compound semiconductor or an arsenide compound semiconductor. The III-V compound semiconductor may be, for example, a nitride such as, for instance, gallium nitride, indium nitride or aluminum nitride, a phosphide such as, for instance, gallium phosphide or indium phosphide a first arsenide such as, for instance, gallium arsenide or indium arsenide. In this case, the material system $Al_nIn_{1-n-m}Ga_mN$ may be provided, for example, wherein $0 \leq n \leq 1$, $0 \leq m \leq 1$ and $n+m \leq 1$ may hold true. Moreover, the material system may comprise $Al_nGa_mIn_{1-n-m}P$, wherein $0 \leq n \leq 1$, $0 \leq m \leq 1$ and $n+m \leq 1$ hold true. Moreover, the material system may comprise $Al_nGa_mIn_{1-n-m}Sb$, wherein $0 \leq n \leq 1$, $0 \leq m \leq 1$ and $n+m \leq 1$ hold true.

Figure 2:
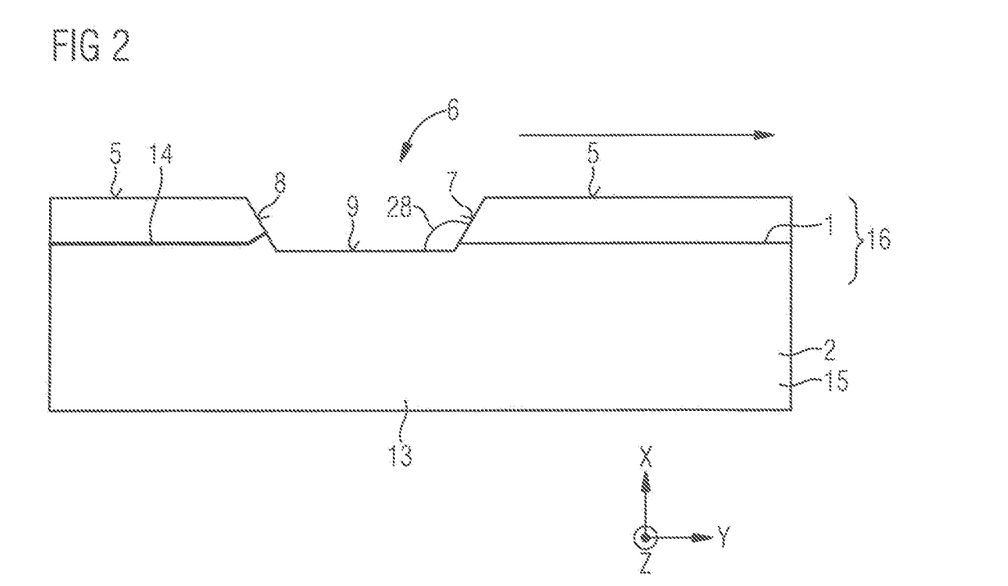
FIG. 2 shows an enlarged illustration of an excerpt from FIG. 1.

FIG. 2 shows the recess 6 from FIG. 1 in an enlarged illustration. The recess 6 comprises, for example, a depth of between 100 nm and 800 nm, preferably between 200 nm and 500 nm, in particular between 300 nm and 450 nm. The depth denotes the distance between the surface 5 and the bottom face 9 parallel to the x-axis. Moreover, the recess 6 may comprise a length along the y-axis that is in the range of between 10 μm and 200 μm, in particular in the range of between 20 μm and 100 μm, in particular between 30 μm and 50 μm. The length denotes the distance between the upper end regions of the side faces 7, 8, that is to say the length in the plane of the surface 5. Moreover, the recess 6 comprises, as viewed along the y-axis, a distance with respect to the ridge 3 that is in the range of between 10 μm and 150 μm, in particular between 20 μm and 100 μm, in particular between 30 μm and 50 μm. In this case, the distance is measured at the surface 5 and extends from the upper edge of the first side face 7 as far as the side face of the ridge 3 that faces the recess 6.

The arrangement also of the second side face 8 in the form of an inclined side face results in the dislocation 14 turning away upward in the region of the second side face 8. Dislocations 14 are intercepted as a result. The epitaxially grown layers 16 in the region of the active zone constitute stressed epitaxial layers with high stress fields. High stress fields arise in particular at the transition between a waveguide layer and an active zone.

Figure 3:
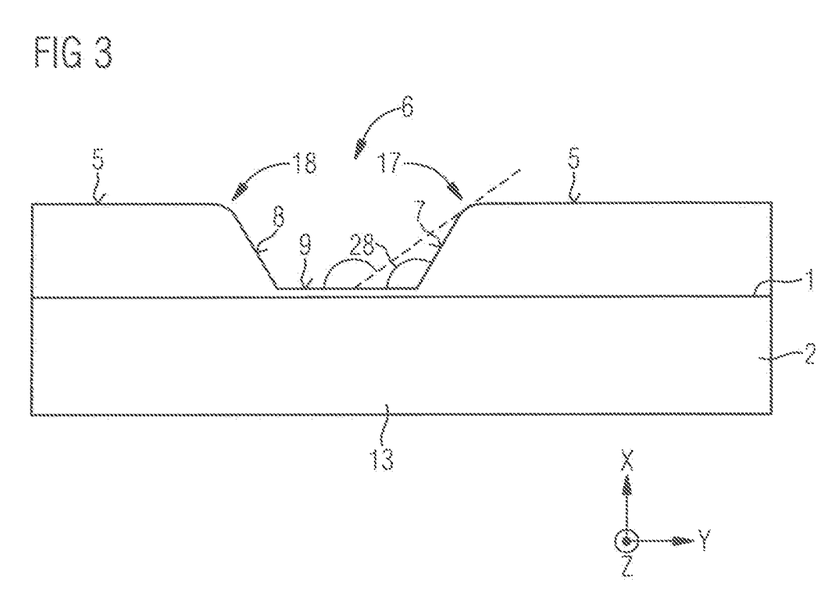
FIG. 3 shows a schematic illustration of a further embodiment of a recess.

FIG. 3 shows, in a schematic illustration, an excerpt from a further optoelectronic component comprising a recess 6, which is configured substantially like the recess in FIG. 2, wherein, however, transition regions 17, 18 between the first side face 7 and the second side face 8 and the corresponding adjoining surface 5 are configured in a rounded-off fashion. The configuration of the rounded-off transition regions 17, 18 reduces stress fields in the transition between the first and second side faces 7, 8 and the surface 5.

Figure 4:
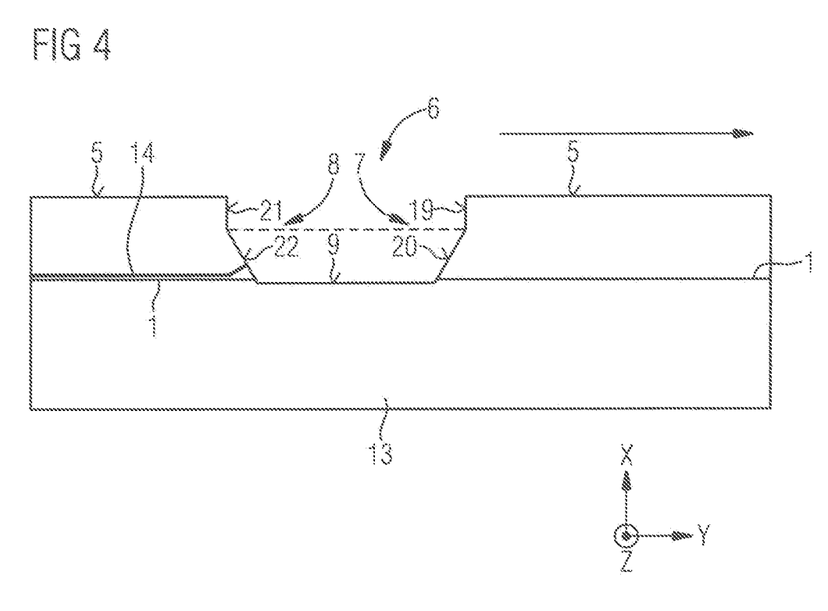
FIG. 4 shows a schematic illustration of a further embodiment of a recess, wherein upper side faces are formed perpendicularly and lower side faces are formed in an inclined manner.

FIG. 4 shows a further embodiment of a recess 6 of an optoelectronic component, wherein the recess 6 comprises side faces 7, 8 subdivided into two side sections 19, 20, 21 and 22. The upper side sections 19, 21 of the side faces 7, 8 are arranged substantially perpendicularly to the first plane, that is to say to the yz-plane. The second side sections 20, 22 of the first and second side faces 7, 8 are configured as inclined faces. The inclination angle is configured in accordance with the inclination angle range of the side faces from FIGS. 1 and 2. The distances and the depths and the lengths of the recess 6 in FIG. 4 are likewise configured in accordance with the ranges of the embodiment from FIG. 2.

Figure 5:
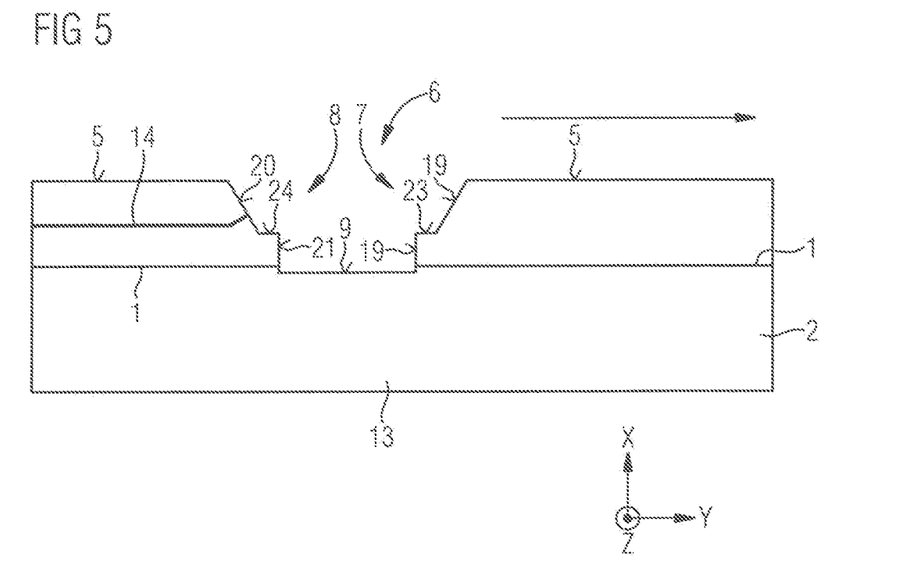
FIG. 5 shows a further embodiment of a recess, wherein upper side faces are formed in an inclined manner and lower side faces are formed perpendicularly.

FIG. 5 shows a further embodiment of a recess, wherein, in this embodiment, the upper side sections 19, 21 are configured as inclined side faces. The inclined side faces are arranged in the angle range of the first and second side faces 7, 8 of the embodiment from FIGS. 1 and 2. The lower side sections 20, 22 of the first and second side faces 7, 8 are arranged substantially perpendicularly to the first plane of the active zone 1, i.e., the y-z plane. Furthermore, a further first bottom face 23 is arranged between the first side section 19 and the second side section 20. Moreover, a further second bottom face 24 is arranged between the further first side section 21 and the further second side section 22. The bottom faces 23 and 24 are arranged at the same height and have an area of the same size.

Figure 6:
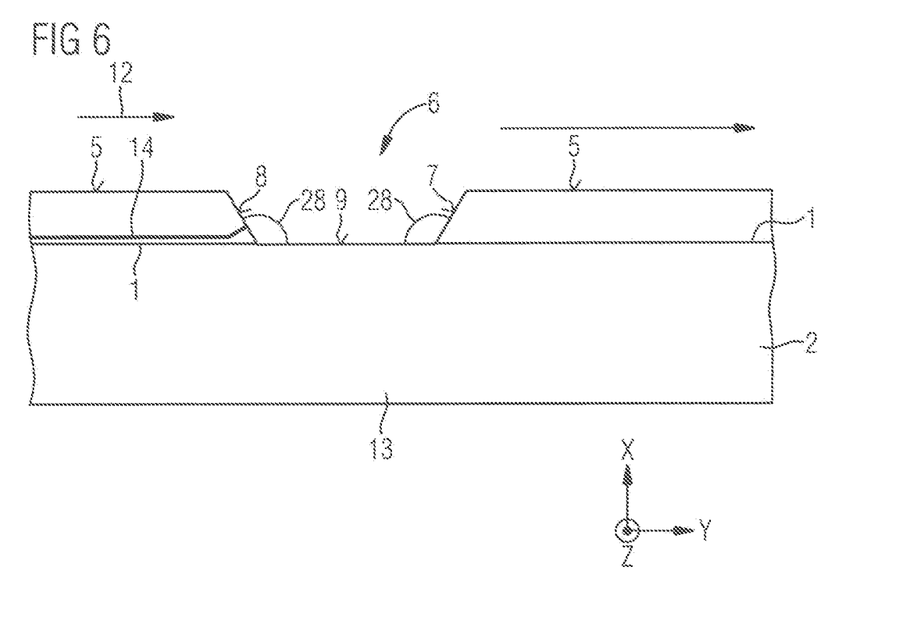
FIG. 6 shows a further embodiment of a recess, wherein the two side faces adopt different angles with respect to the plane of the active zone.

FIG. 6 shows a further embodiment of a recess 6 of an optoelectronic component in accordance with FIG. 1, wherein the two side faces 7, 8 comprise different inclination angles 28 relative to the first plane of the active zone 1. In particular, the inclination angle of the first side face 7, facing the ridge 3, is smaller than the inclination angle of the second side face 8. The second side face 8 faces the side from which the end face 13 is fractured in the fracture direction 12. The angles of the inclination of the side faces 7, 8 may be aligned in accordance with the indicated angle ranges between 98° and 160°, in particular between 98° and 130°, in particular between 100° and 115°, relative to the first plane of the active zone 1. Depending on the embodiment chosen, the inclination angle of the first side face 7, facing the ridge 3, may be greater than the inclination angle of the second side face 8. Moreover, the inclination angles of the two side faces 7, 8 may also be identical, that is to say that the two side faces 7, 8 may be arranged mirror-symmetrically with respect to an imaginary center plane arranged between the two side faces.

Figure 7:
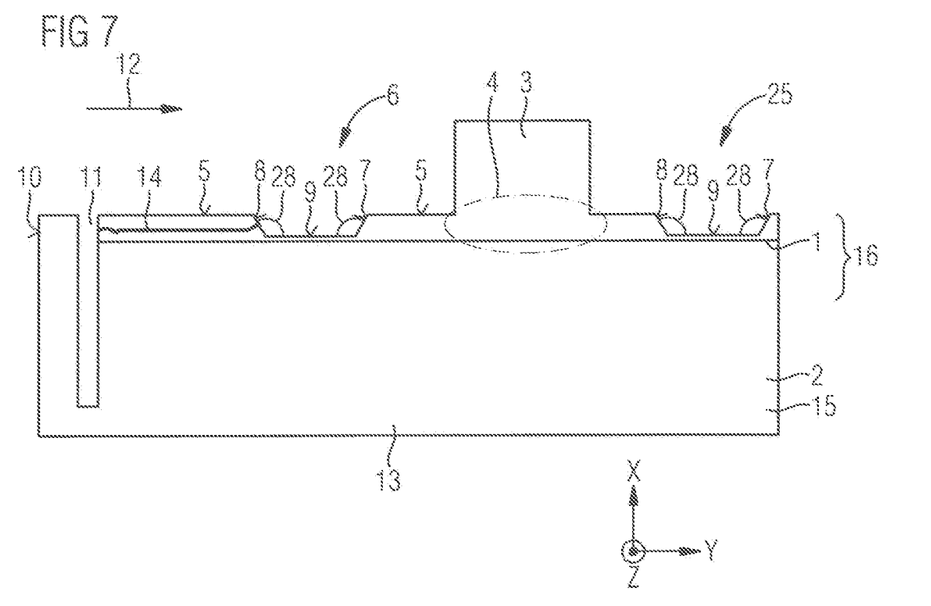
FIG. 7 shows a further embodiment, where two recesses are arranged on opposite sides of a ridge of the laser diode.

FIG. 7 shows a further embodiment of an optoelectronic component that is configured substantially in accordance with FIG. 1, wherein, however, a recess 6, 25 is introduced into the surface 5 of the layer structure 2 on both sides of the ridge 3. The second recess 25 may be configured identically to the recess 6. In particular, the second recess 25 may be configured mirror-symmetrically with respect to the recess 6 in relation to the ridge 3. Furthermore, the recesses 6, 25 may comprise different shapes and depths.

Figure 8:
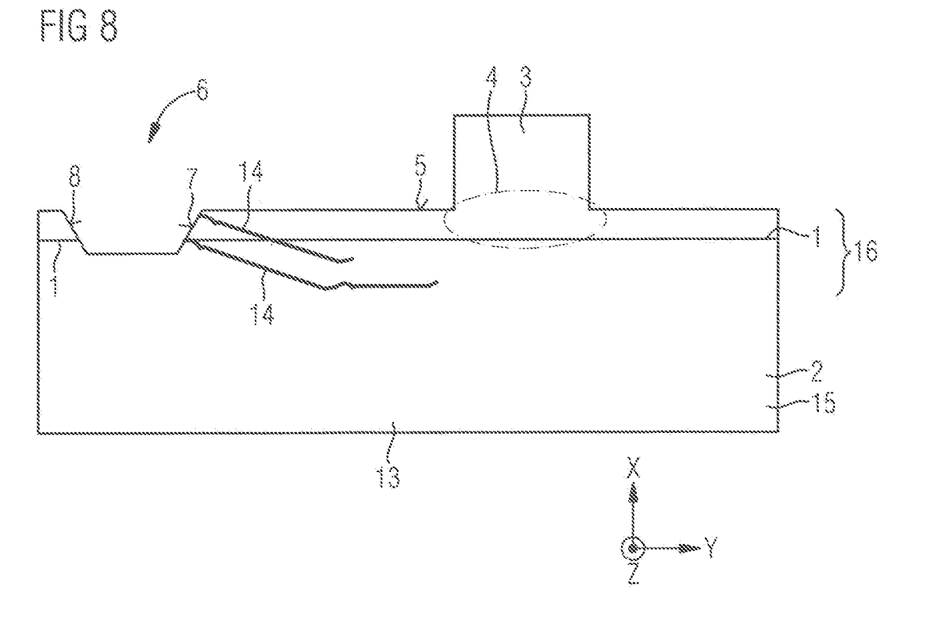
FIG. 8 shows a plan view of an end face of a laser diode with a further embodiment of a recess and dislocations illustrated schematically.

FIG. 8 shows a further embodiment of an optoelectronic component, wherein the recess 6 is formed more deeply and the first and/or the second side face 7, 8 are/is arranged in a manner inclined at an angle of between 98° and 130°, in particular at an angle of between 100° and 115°, with respect to the first plane of the active zone 1. In this embodiment, the trench 11 may also be dispensed with. Particularly by means of an inclined side face which faces the active region of the active zone, what is achieved is that dislocations 14 that form proceeding from the recess 6 in the direction of the active region of the active zone 1 are diverted downward and extend below the active zone 1. This effect is brought about by virtue of the fact that dislocations 14 always form perpendicularly to a side face 7.

Figure 9:
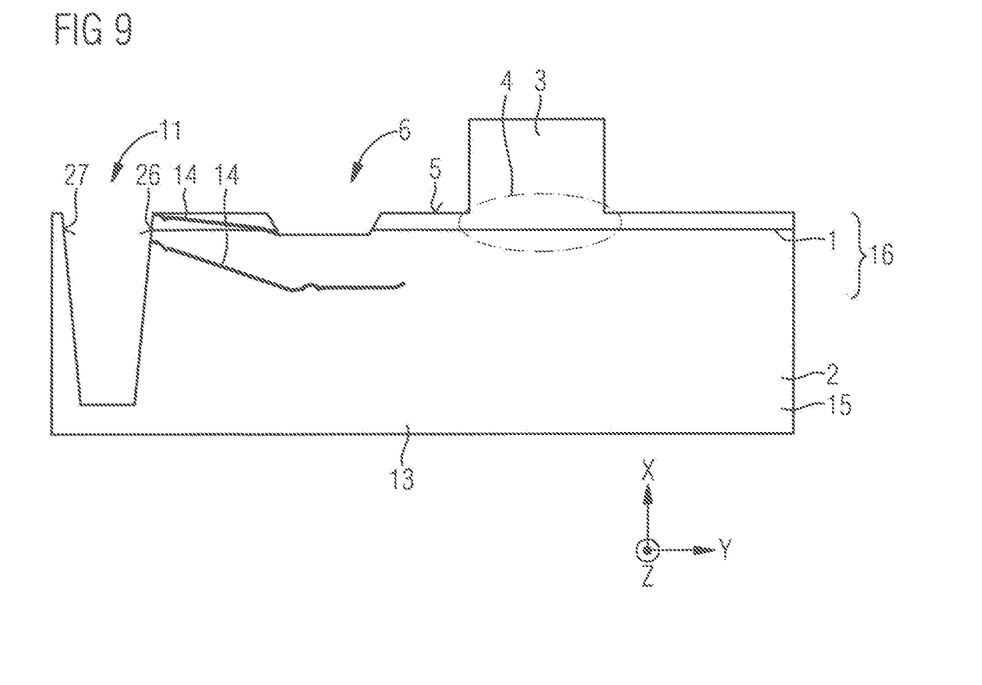
FIG. 9 shows a plan view of an end face of an optoelectronic component with a recess and with a mesa trench.

FIG. 9 shows a further embodiment of an optoelectronic component, wherein the trench 11 likewise comprises inclined third and fourth side faces 27, 26. The side faces 27, 26 may comprise an inclination in accordance with the side faces 7, 8. Particularly as a result of the configuration of the third side face 26 arranged in an inclined manner, dislocations 14 that form at the third side face 26 are led below the region of the laser mode 4 on account of the inclined arrangement of the third side face 26. Consequently, this type of dislocations may produce no or only a small impairment of the quality of the fractured end face 13 in the region of the laser mode 4, i.e., in the active region of the active zone 1.

Figure 10:
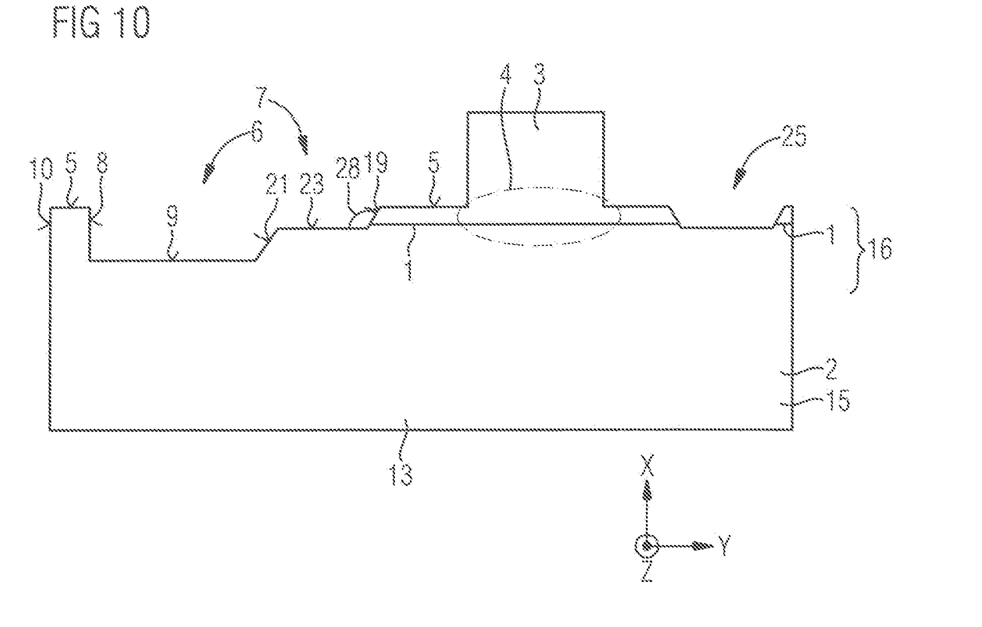
FIG. 10 shows a further embodiment, wherein a mesa trench transitions into a recess.

FIG. 10 shows a further embodiment of an optoelectronic component, wherein the recess 6 comprises a stepped first side face 7 and a perpendicularly arranged second side face 8. The first side face 7 comprises an upper first side section 19, a lower second side section 20 and a further first bottom face 23. Both the upper and the lower side section 19, 20 are arranged in an inclined manner in an angle range with respect to the first plane of the active zone 1. The angle may be in an angle range of between 95° and 160°, in particular between 98° and 130°, in particular between 100° and 115°. Depending on the embodiment chosen, the first and second side sections 19, 20 may comprise the same angle or different angles. The further first bottom face 23 is arranged parallel to the first plane of the active zone 1. Moreover, depending on the embodiment chosen, a second recess 25 may also be provided. The second recess 25 may be configured in accordance with the recess 6 from FIG. 2.

The further first bottom face 23 is arranged at the depth at which the bottom face 9 and the recess 6 from FIG. 2 are arranged. The further first bottom face 23 is arranged in a range of between 100 nm and 800 nm below the surface 5. Moreover, the first bottom face 23 is arranged in a range of between 200 nm above and 200 nm below the plane of the active zone. In this embodiment, the bottom face 9 is arranged more deeply than the further first bottom face 23 of the active zone 1 and thus replaces the function of a mesa trench, that is to say of the deeper trench 11 from FIG. 1. The bottom face 9 is arranged, for example, more deeply than 200 nm below the plane of the active zone 1.

Figure 11:
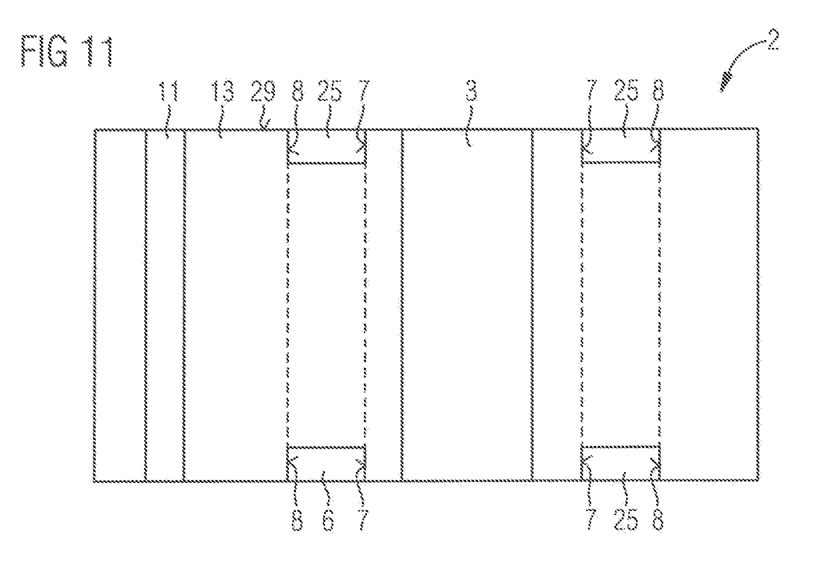
FIG. 11 shows a view from above of a component.

FIG. 11 shows a laser diode comprising a ridge 3, a mesa trench 11 and two opposite end faces 13, 29. In addition, the illustration shows four recesses 6, 25 adjoining the end faces 13, 29. Depending on the embodiment chosen, the recesses 6, 25 may be configured in accordance with the examples described above. In addition, the recesses 6, 25 may run parallel to the ridge, as is illustrated schematically by dashed lines.

For efficient current carrying and waveguiding, semiconductor diodes require a multiplicity of epitaxial individual layers comprising layer thicknesses in the range of from a few nanometers to hundreds of nm. Each of said layers comprises a specific material composition composed of gallium nitride, and/or aluminum gallium nitride, and/or indium gallium nitride and/or aluminum indium gallium nitride. The layers are typically deposited by means of MOCVD at temperatures of between 600 and 1200° C. The layer structure 2 is stressed to a greater or lesser extent. During the cleavage of laser facets, that is to say of end faces 13 for edge emitting laser diodes or LEDs, along specific layer planes steps thus occur at the cleaved end face 13. Disturbances in the facet quality may originate, for example, in substrates produced in an ELOG-like manner with defect-rich zones or at skips.

In this case, the production of recesses 6 comprising inclined side faces 7, 8 and in particular comprising rounded transition regions 17, 18 may be achieved by using resist masks instead of hard masks and with a plasma etching process optimized specifically for forming such inclined side faces and comprising a high removal rate. The use of other masks that are removed to a medium to high extent during the etching process and thus lead to an inclined angle of the side faces 7, 8 also constitute a technological possibility for producing the recesses 6, 25 with inclined side faces. The recesses 6, 25 may be produced in various ways. By the use of two etching masks arranged one above the other. In this case, in the first etching step, a yielding mask with comparatively high etching removal is used to produce the inclined side faces 7, 8. In a second etching step, a hard mask is used here, which produces perpendicular side sections. In this step, the recess 6 is etched to the desired depth, wherein the side faces 7, 8 arranged in an inclined manner are maintained in a critical lower region. By way of example, the transition from the first to the second step may also take place when the first mask with a high etching removal is used up, that is to say completely removed. In addition, etching masks comprising different hardnesses and thus different removal rates may be arranged on opposite sides of the recess. As a result, on the different sides, different inclination angles of the side faces may be achieved in a simple manner by means of etching masks that are to be removed laterally to different extents. A soft etching mask may consist, e.g., of photoresist that is used for photolithographic methods. Moreover, the soft mask may also consist of SiNx or a semiconductor material or a metal.

Moreover, the recesses 6, 25 may also be produced by the use of two etching process steps, wherein the first etching process step comprises a high removal rate and thus produces side faces 7, 8 arranged in an inclined manner. In the second process step, in order to etch the recesses 6, 25 to the desired depth, use is made of an etching plasma and corresponding plasma parameters which comprise a lower removal rate and produce perpendicular flanks. In this case, less damage to the adjoining layer structure 2 is brought about in critical depth ranges of the recesses 6, 25 on account of the lower removal rate. Nevertheless, the side faces 7, 8 arranged in an inclined manner may be maintained. Moreover, the opposite case is also possible, wherein the side faces 7, 8 arranged in an inclined manner are situated in the upper part of the recesses 6, 25. This may be achieved, for example, in a process-dictated manner by means of the different etching rates and different epitaxial layers.

Figure 12:
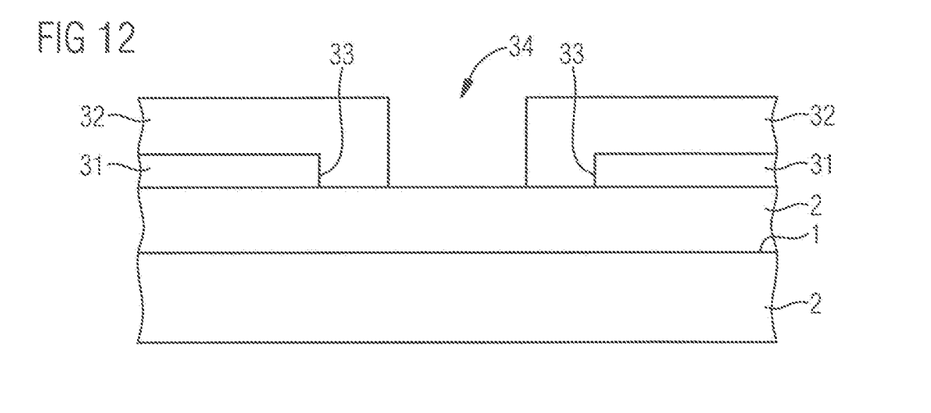
FIGS. 12 to 14 show method steps of a first method for producing the recess.
Figure 13:
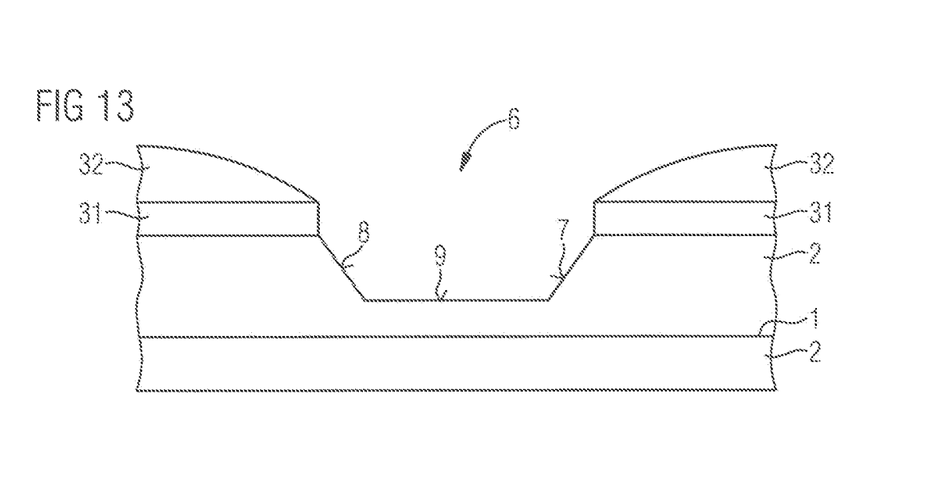
Figure 14:
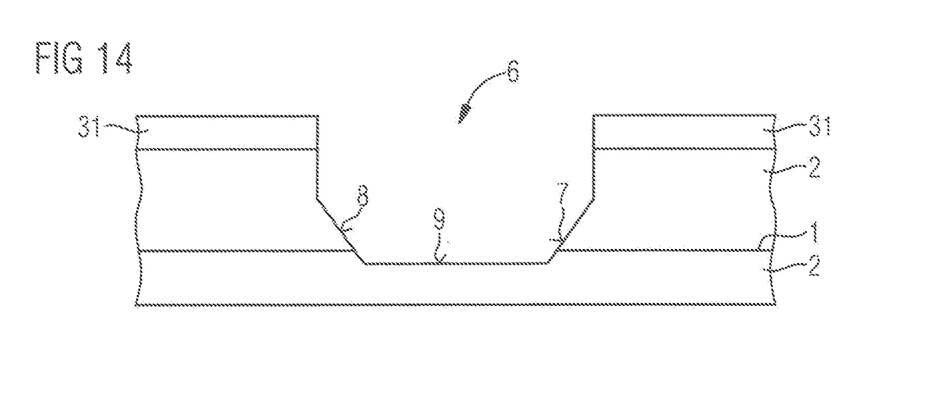

FIGS. 12 to 14 show steps of a first method for introducing the recess 6 into a layer structure 2. FIG. 12 shows, in a schematic illustration, a layer structure 2 comprising epitaxial layers, which comprises an active zone 1 for generating an electromagnetic radiation. The layer structure 2 may be applied on a carrier, which is not illustrated. A first etching mask 31 is applied on the layer structure 2. A second etching mask 32 is applied on the first etching mask. The second etching mask 32 covers an edge region 33 of the first etching mask and thereby defines an etching opening 34. In the example illustrated, the second etching mask 32 comprises a lower hardness than the first etching mask 31 and/or an etching method that brings about a lateral removal of the second etching mask 32 is used in a first etching step. The lower hardness of the second etching mask brings about a lateral removal of the second etching mask during the etching process.

As a result, as illustrated in FIG. 13, a recess 6 is obtained which comprises inclined side faces 7, 8. In a second etching step, the depth of the recess 6 is then increased, wherein the structure of the bottom face with the inclined side faces 7, 8 is preserved. For this purpose, the first etching mask 31 is formed from a harder material, such that substantially no lateral removal of the first etching mask 31 takes place during the second etching step. Moreover, an etching method that brings about a small or no lateral removal of the first etching mask 31 may be used during the second etching step. With the aid of the second etching step, the bottom face 9 of the recess 6 is brought down to the desired depth in the region of the plane of the active zone 1, as is illustrated in FIG. 14. In this case, on account of the stability of the first etching mask 31 in the upper region of the recess 6 side faces are formed which are arranged substantially perpendicularly to the plane of the active zone 1.

Figure 15:
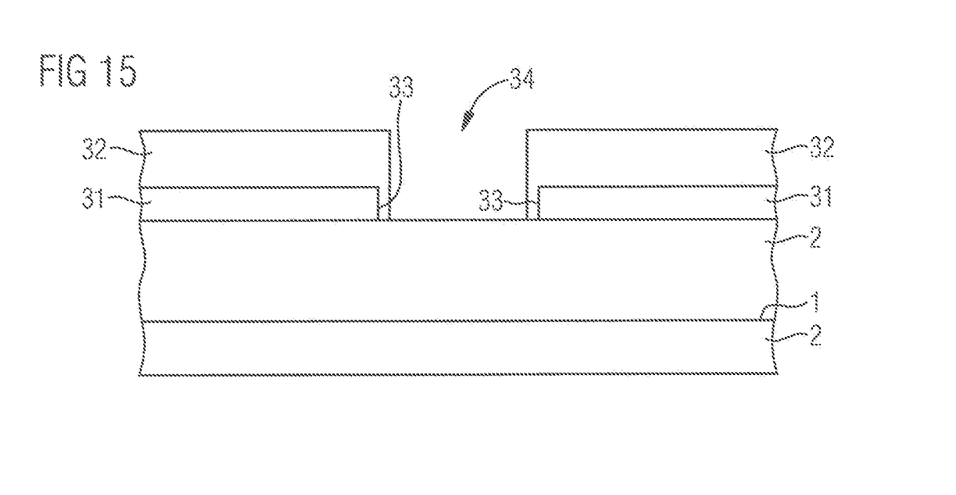
FIGS. 15 to 18 show method steps of a second method for producing a recess.

FIGS. 15 to 18 show method steps of a second method for introducing a recess 6 into a layer structure 2. FIG. 15 shows, in a schematic illustration, a layer structure 2 comprising epitaxial layers and comprising an active zone 1 for generating an electromagnetic radiation. The layer structure 2 may be applied on a carrier, which is not illustrated. A first etching mask 31 is applied on the layer structure 2. A second etching mask 32 is applied on the first etching mask 31. The second etching mask 32 covers an edge region 33 of the first etching mask only slightly or not at all. Consequently, the etching opening 34 is defined by the second etching mask 32, as illustrated, or by the first etching mask 31. In the example illustrated, the second etching mask 32 has a greater hardness than the first etching mask 31 and/or an etching method that brings about substantially no lateral removal of the second etching mask 32 is used in a first etching step.

Figure 16:
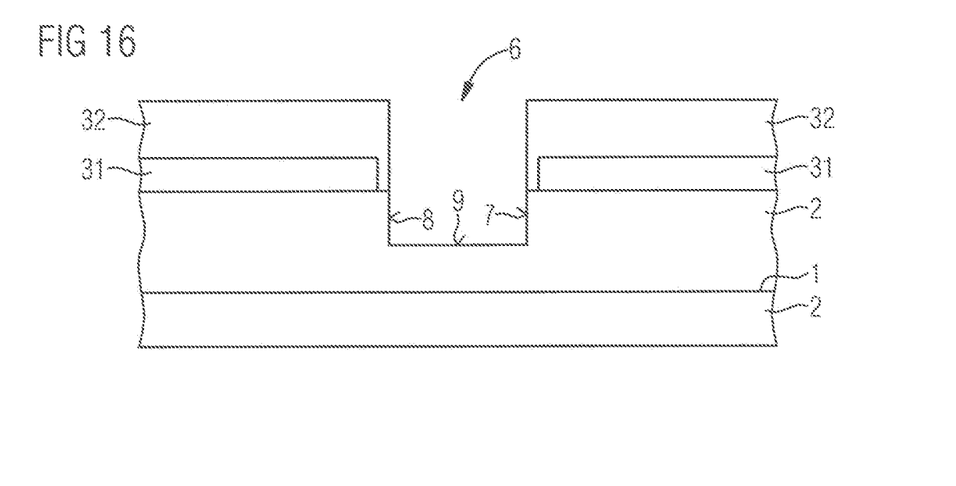
Figure 17:
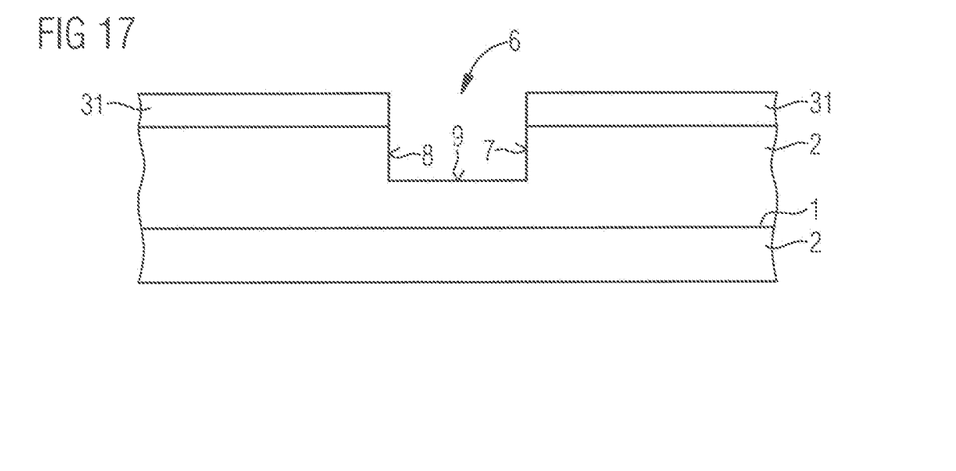
Figure 18:
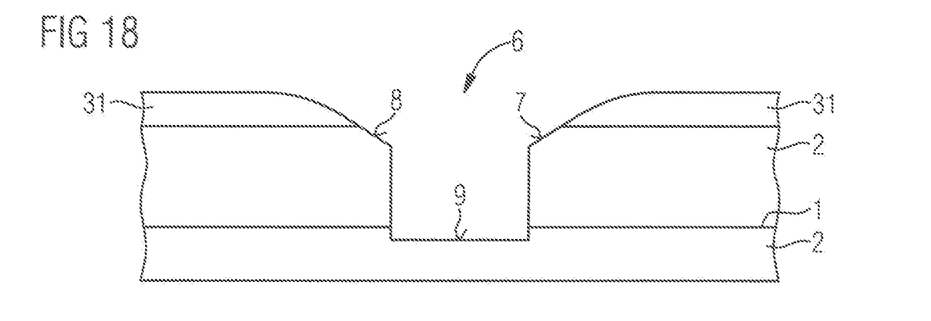

As a result, as illustrated in FIG. 16, a recess 6 is obtained which comprises side faces which are arranged substantially perpendicularly to the plane of the active zone 1. Afterward, the second etching mask 32 is removed, as is illustrated in FIG. 17. In a subsequent second etching step, the depth of the recess 6 is then increased, wherein the lower structure of the recess 6 with the bottom face and with the perpendicular side faces in the lower region of the recess is maintained. However, side faces 7, 8 arranged in an inclined manner are formed in the upper region of the recess 6. For this purpose, the first etching mask 31 may be formed from a softer material, such that a lateral removal of the first etching mask 31 takes place during the second etching step. Moreover, an etching method that brings about a lateral removal even of a harder first etching mask 31 may be used during the second etching step. With the aid of the second etching step, the depth of the bottom face 9 of the recess 6 is brought down to the desired depth in the region of the plane of the active zone 1, as illustrated in FIG. 18.

Figure 19:
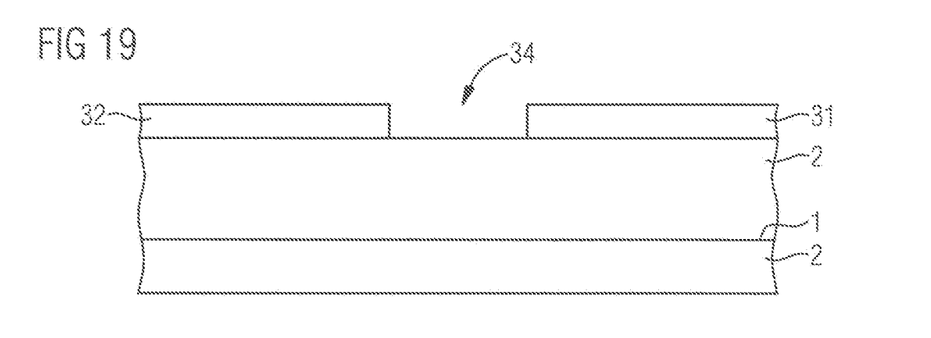
FIGS. 19 and 20 show method steps of a third method.
Figure 20:
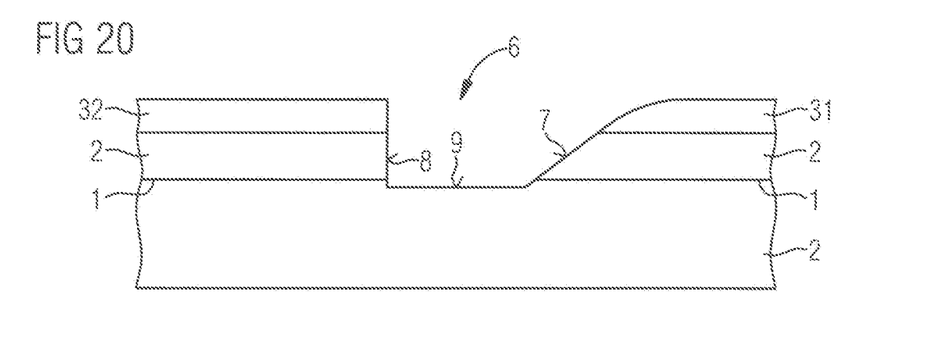

FIGS. 19 and 20 show method steps of a third method, by which a recess 6 comprising differently inclined side faces 7, 8 may be introduced into a layer structure 2 comprising epitaxial layers and an active zone 1 for generating electromagnetic radiation. For this purpose, a first and a second etching mask 31, 32 are arranged on the layer structure 2, said etching masks delimiting an etching opening 34 from two sides. In the example illustrated, the second etching mask 32 comprises a lower hardness than the first etching mask 31, such that at the second etching mask 32 during an etching process a lateral removal takes place which is greater than the lateral removal of the first etching mask 31. A recess 6 comprising a bottom face 9 and two differently inclined side faces 7, 8 is obtained in this way. The bottom face 9 is arranged in the desired region in proximity to the plane of the active zone 1. The inclinations of the side faces 7, 8 may be set by means of different hardnesses or lateral durability of the etching masks vis-à-vis the etching method. In the example illustrated, the first side face 7 comprises an angle of 95° to 160° relative to the plane of the active zone 1. The second side face 8 is arranged perpendicularly to the plane of the active zone 1. Accordingly, the second etching mask 32 was not removed or was scarcely removed laterally. Depending on the embodiment chosen, the first and/or the second side face 7, 8 may also comprise other inclination angles; in particular, the inclination angle of the second side face 8 may also be in the range of between 95° and 160° relative to the plane of the active zone 1.

What is claimed is:

1. An optoelectronic component comprising:
a layer structure, comprising an active zone for generating an electromagnetic radiation, wherein the active zone comprises a plurality of layers of the layer structure, wherein the active zone is arranged in a first plane perpendicular to a layer stacking direction of the plurality of layers, wherein a surface of the layer structure has a recess formed therein, wherein the recess adjoins side face of the component and extends from the side face into the layer structure, wherein the side face is arranged in a second plane and extends from a topmost surface of the layer structure, past the recess with the recess forming an edge of the side face, to a bottom surface of the layer structure, wherein the second plane is substantially perpendicular to the first plane, wherein the recess comprises a bottom recess face and a first side recess face, wherein the first side recess face is arranged substantially perpendicularly to the side face, wherein the first side recess face is arranged in a manner inclined at an angle different from 90° with respect to the plane of the active zone, wherein the bottom recess face is arranged in a region of the first plane of the active zone, wherein the recess further comprises a second side recess face, and wherein the second side recess face is arranged opposite with respect to the first side recess face, wherein the first and second side recess faces are arranged at different angles with respect to the plane of the active zone.

2. The component according to claim 1, wherein the bottom recess face is arranged at a depth of between 100 nm and 800 nm below the surface of the layer structure.

3. The component according to claim 1, wherein the first side recess face is arranged in a manner inclined at an angle between 95° and 160° with respect to the plane of the active zone.

4. The component according to claim 1, wherein the second side recess face is arranged in a manner inclined at an angle between 95° and 160° with respect to the plane of the active zone.

5. The component according to claim 1, wherein at least one of the first side recess face or the second side recess face is arranged in a manner inclined at an angle between 98° and 130° with respect to the plane of the active zone.

6. The component according to claim 1, wherein at least one of the first side recess face or the second side recess face comprises:
a first face section arranged substantially perpendicularly relative to the first plane; and an inclined second face section, wherein the inclined second face section is arranged in an upper face section of the at least one of the first side recess face or the second side recess face in relation to a depth of the at least one of the first side recess face or the second side recess face, and wherein the first face section is arranged in a lower region of the at least one of the first side recess face or the second side recess face.

7. The component according to claim 1, wherein at least one of the first side recess face or the second side recess face comprises:
   a first face section arranged substantially perpendicularly relative to the first plane; and
   an inclined second face section, wherein the inclined second face section is arranged in a lower face section of the at least one of the first side recess face or the second side recess face in relation to a depth of the at least one of the first side recess face or the second side recess face, and wherein the first face section is arranged in an upper region of the at least one of the first side recess face or the second side recess face.

8. The component according to claim 1, wherein the recess comprises at least one rounded transition disposed in a plane parallel to the second plane and disposed between at least one of the first side recess face or the second side recess face and at least one of a top side of the layer structure or a bottom face of the recess.

9. The component according to claim 1, wherein at least one of the first side recess face or the second side recess face comprises a stepped shape comprising at least two side sections, wherein each of the at least two side sections are arranged in a laterally offset fashion in relation to other ones of the at least two side sections, wherein the at least two side sections are each connected to one another via a bottom face, and wherein at least one side section of the at least two side sections is formed as an inclined side face.

10. The component according to claim 1, wherein the recess has a width in the second plane that is in a range of 10 μm to 200 μm.

11. The component according to claim 1, wherein the recess has a distance from a ridge, wherein the distance is in a range of 10 μm to 150 μm.

12. The component according to claim 1, wherein a mesa trench is provided, wherein the mesa trench is arranged in the second plane in a laterally offset fashion with respect to the recess between a side of the component and the recess.

13. The component according to claim 1, wherein the first side recess face and the second side recess face each comprise:
   a first face section arranged substantially perpendicularly relative to the first plane; and
   an inclined second face section, wherein the inclined second face section of each of the first side recess face and the second side recess face is arranged in an upper face section of a respective one of the first side recess face and the second side recess face in relation to a depth of the respective one of the first side recess face and the second side recess face, and wherein the first face section of each of the first side recess face and the second side recess face is arranged in a lower region of the respective one of the first side recess face and the second side recess face.

14. The component according to claim 1, wherein the first side recess face and the second side recess face each comprise:
   a first face section arranged substantially perpendicularly relative to the first plane; and
   an inclined second face section, wherein the inclined second face section of each of the first side recess face and the second side recess face is arranged in a lower face section of a respective one of the first side recess face and the second side recess face in relation to a depth of the respective one of the first side recess face and the second side recess face, and wherein the first face section of each of the first side recess face and the second side recess face is arranged in an upper region of a respective one of the first side recess face and the second side recess face.

15. A method for producing the component according to claim 1, wherein the recess is introduced into the layer structure with the aid of an etching process, wherein a lateral widening of an etching opening of an etching mask is at least partly carried out during the etching process, such that the recess is introduced into the layer structure, and resulting in the recess comprises at least one side face of the recess arranged in an inclined manner.

16. The method according to claim 15, wherein etching masks of different hardnesses are used in order to produce a recess comprising at least one inclined side face.

17. The method according to claim 16, wherein a first etching mask that is softer than another mask of the etching masks is a mask composed of photoresist or SiNx or a semiconductor material or is formed from metal, wherein the first etching mask is removed in particular at least partly laterally during the etching.

\* \* \* \* \*